(12) United States Patent
Hiti et al.

(10) Patent No.: US 9,335,361 B2
(45) Date of Patent: May 10, 2016

(54) METHOD AND APPARATUS FOR MONITORING A MULTI-PHASE ELECTRICAL SYSTEM ON A VEHICLE

(71) Applicant: GM GLOBAL TECHNOLOGY OPERATIONS LLC, Detroit, MI (US)

(72) Inventors: Silva Hiti, Redondo Beach, CA (US); Steven E. Schulz, Torrance, CA (US); Millin Perisic, Cypress, CA (US); William R. Cawthorne, Milford, MI (US); Mark A. Vernacchia, Northville, MI (US); Aubrey Walter Downs, Jr., Brighton, MI (US); Gabriel Gallegos-Lopez, Lomita, CA (US); Michael D. Haggerty, Sterling Heights, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 265 days.

(21) Appl. No.: 13/910,096

(22) Filed: Jun. 4, 2013

(65) Prior Publication Data

US 2014/0354292 A1   Dec. 4, 2014

(51) Int. Cl.
*G01R 31/00* (2006.01)
*G01R 31/02* (2006.01)
*B60L 3/00* (2006.01)

(52) U.S. Cl.
CPC ............. *G01R 31/005* (2013.01); *B60L 3/0023* (2013.01); *G01R 31/007* (2013.01); *G01R 31/026* (2013.01)

(58) Field of Classification Search
CPC .. G01R 31/005; G01R 31/024; G01R 19/175; G01R 29/18; G01R 31/02; G01R 31/025; G01R 31/026; G01R 31/08; G01R 31/085; G01R 31/086; G01R 31/11; G01R 31/327; G01R 31/343; G01R 31/42
See application file for complete search history.

(56) References Cited

U.S. PATENT DOCUMENTS

| | | | |
|---|---|---|---|
| 2007/0001669 A1* | 1/2007 | Narumi et al. | G01D 5/208 324/207.25 |
| 2009/0066286 A1* | 3/2009 | Gunji | B62D 5/0487 318/490 |

\* cited by examiner

*Primary Examiner* — Tung X Nguyen

(57) ABSTRACT

An electric machine electrically connects to an inverter via a multi-phase power circuit. A method for monitoring the multi-phase power circuit includes non-intrusively adjusting a commanded AC electric current from the inverter after a prescribed time period and comparing a measured magnitude of AC electric current in the multi-phase power circuit with a minimum threshold. Presence of an open circuit fault in the multi-phase power circuit can be detected based upon the comparison.

6 Claims, 2 Drawing Sheets

METHOD AND APPARATUS FOR MONITORING A MULTI-PHASE ELECTRICAL SYSTEM ON A VEHICLE

TECHNICAL FIELD

This disclosure is related to multi-phase AC electrical systems employed on a vehicle, including related diagnostic monitoring systems.

BACKGROUND

The statements in this section merely provide background information related to the present disclosure. Accordingly, such statements are not intended to constitute an admission of prior art.

Vehicle systems employ electric machines to generate torque that can be employed to propel the vehicle and to provide mechanical power for on-vehicle subsystems such as hydraulic pumps. Such electric machines include multi-phase permanent magnet or induction motors that connect to power inverter systems via high-voltage electrical cables and electrical connectors. Under certain conditions, e.g., during vehicle servicing, the high-voltage electrical cables may be disconnected from the electric machines.

SUMMARY

An electric machine electrically connects to an inverter via a multi-phase power circuit. A method for monitoring the multi-phase power circuit includes non-intrusively adjusting a commanded AC electric current from the inverter after a prescribed time period and comparing a measured magnitude of AC electric current in the multi-phase power circuit with a minimum threshold. Presence of an open circuit fault in the multi-phase power circuit can be detected based upon the comparison.

BRIEF DESCRIPTION OF THE DRAWINGS

One or more embodiments will now be described, by way of example, with reference to the accompanying drawings, in which.

DETAILED DESCRIPTION

Figure 1:
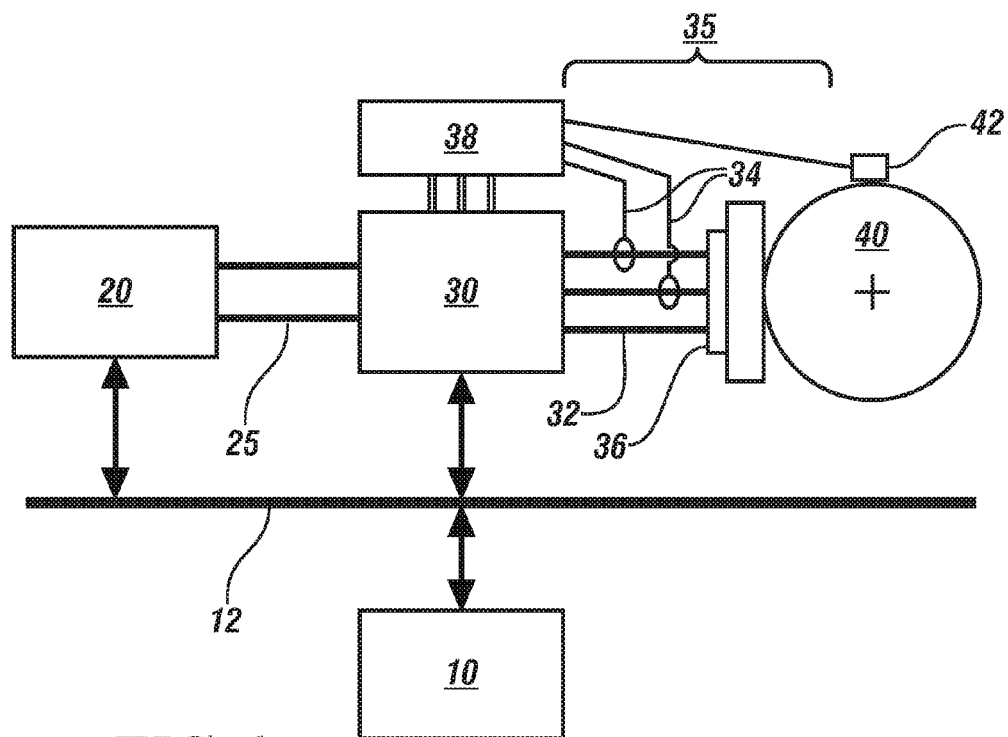
FIG. 1 illustrates a system including a multi-phase electric machine (motor), in accordance with the disclosure.

Referring now to the drawings, wherein the showings are for the purpose of illustrating certain exemplary embodiments only and not for the purpose of limiting the same, FIG. 1 schematically illustrates a system including a multi-phase electric machine (motor) 40 that is employed on a vehicle to generate torque for propulsion and other on-vehicle applications. One non-propulsion torque application includes employing the motor 40 to power a hydraulic pump.

The system includes a high-voltage electric power source (battery) 20 that electrically couples to an inverter module 30 via a high-voltage DC power bus 25. The inverter module 30 electrically connects to a multi-lead high-voltage electric cable 32 that terminates in a high-voltage electrical connector 36. The high-voltage electrical connector 36 electrically and mechanically connects to corresponding high-voltage cables on the motor 40. There can be one or a plurality of electrical interfaces between the inverter module 30, the multi-lead high-voltage electric cable 32, the high-voltage electrical connector 36 and the corresponding high-voltage cables on the motor 40. Current sensors 34 are deployed to monitor two or more of the electrical leads of the electric cable 32, and are signally connected to an inverter controller 38 operatively connected to the inverter module 30 for current monitoring and control. A rotational position sensor 42 monitors rotational position and speed of the motor 40 and signally connects to the inverter controller 38. A high-voltage AC power circuit 35 is a wiring harness that is formed by AC electrical outlets from the inverter module 30 that connects to the multi-lead high-voltage electric cable 32, the high-voltage electrical connector 36, and the high-voltage cables on the motor 40. A controller 10 signally connects via bus 12 to the battery 20 and the inverter module 30 to monitor operation and/or effect control thereof as part of an overall vehicle control system.

Control module, module, control, controller, control unit, processor and similar terms mean any one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs or routines, combinational logic circuit(s), input/output circuit(s) and devices, appropriate signal conditioning and buffer circuitry, and other components to provide the described functionality. Software, firmware, programs, instructions, routines, code, algorithms and similar terms mean any instruction sets including calibrations and look-up tables. The control module has a set of control routines executed to provide the desired functions. Routines are executed, such as by a central processing unit, and are operable to monitor inputs from sensing devices and other networked control modules, and execute control and diagnostic routines to control operation of actuators. Routines may be executed at regular intervals, for example each 100 microseconds and 3.125, 6.25, 12.5, 25 and 100 milliseconds during ongoing engine and vehicle operation. Alternatively, routines may be executed in response to occurrence of an event.

Under certain circumstances, one of the electrical interfaces of the high-voltage AC power circuit 35 can physically disconnect and the electrical cables can become physically exposed between the inverter module 30, the multi-lead high-voltage electric cable 32, the high-voltage electrical connector 36 and the high-voltage cables on the motor 40. By way of example, the multi-lead high-voltage electric cable 32 can disconnect from the high-voltage electrical connector 36. Thus, monitoring the multi-phase power circuit 35 includes monitoring commanded AC electric current between the inverter 30 and the motor 40 at prescribed time intervals. When the commanded AC electric current is less than a threshold magnitude and a prescribed time interval has passed from the last monitoring event, the commanded AC electric current is non-intrusively adjusted to a magnitude of AC electric current that is equal to the threshold magnitude. A measured magnitude of AC electric current flowing through the AC cables is compared with the threshold magnitude of AC electric current. Presence of a fault in the multi-phase power circuit 35 can be detected based upon the comparison. An embodiment of this is described with reference to FIGS. 2 and 3.

Figure 2:
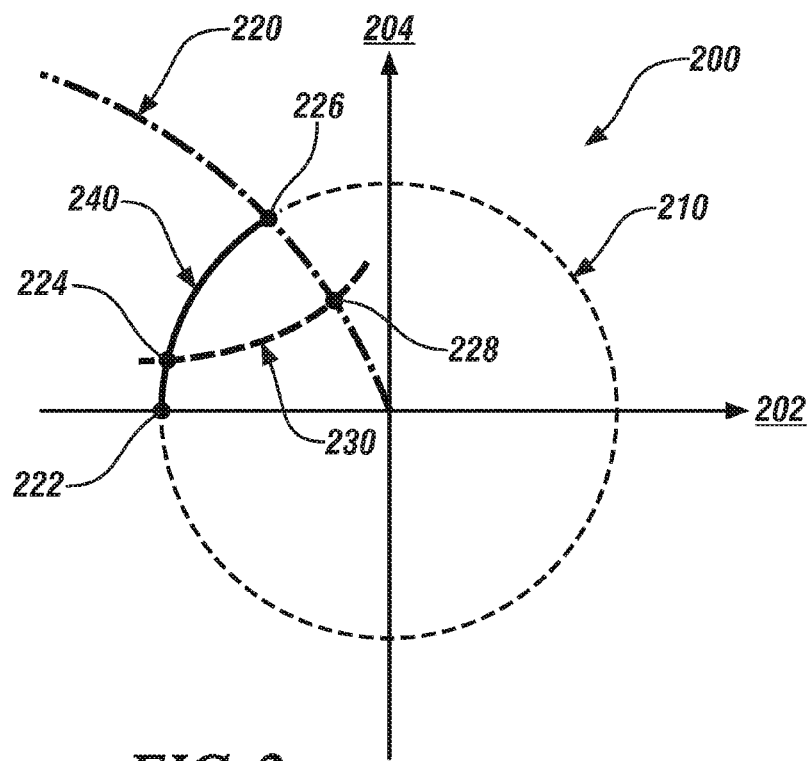
FIG. 2 illustrates electric current properties for an embodiment of the motor plotted in context of an Id/Iq plane, including a trajectory showing a constant current magnitude, a maximum torque per ampere curve (MTPA) and a constant torque line, in accordance with the disclosure.

FIG. 2 graphically shows electric current properties for an embodiment of the motor described with reference to FIG. 1, employing direct (Id) and quadrature (Iq) current axes. The use of direct and quadrature current axes is known in the art and not described in detail. The current properties are plotted in context of an Id/Iq plane 200, with the Id current shown on the x-axis 202 and the Iq current shown on the y-axis 204. Circle 210 represents a trajectory showing a constant current magnitude, and as shown represents a minimum commanded AC electric current that can overcome a signal/noise ratio of the current sensors. Line segment 220 shows a maximum torque per ampere curve (MTPA) for the motor, and line segment 230 shows a constant torque line (Ti) for the motor. In a situation where the magnitude of torque is shown on the constant torque line segment 230, point 228 represents the MTPA for operating the motor, and point 224 shows the same magnitude of torque output as point 222 projected onto the constant current circle 210. The difference between the points on the constant torque line segment 230 is based upon differences in the direct current and corresponding difference in the quadrature current. The exemplary operating point and adjustment shown herein is for an interior permanent magnet (IPM) machine. An analogous analysis process can be made for an induction machine (IM).

Figure 3:
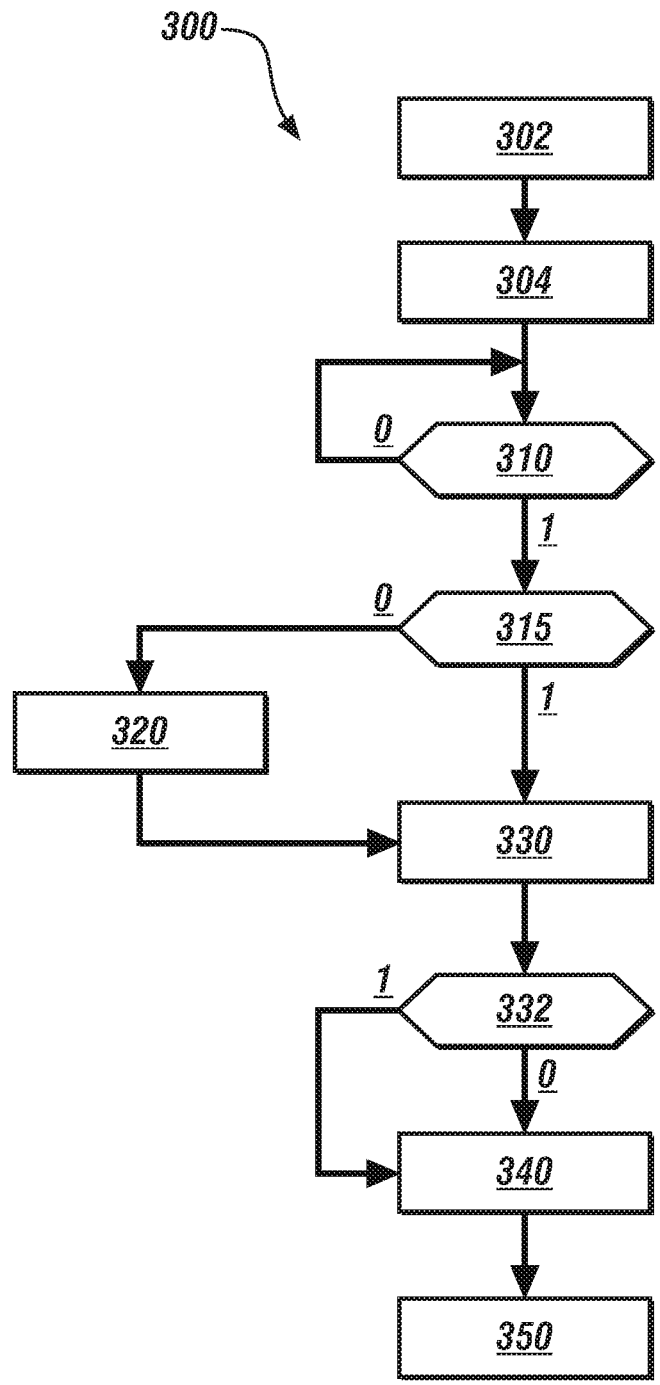
FIG. 3 illustrates a high-voltage electrical cable monitoring scheme that is employed to monitor high-voltage electric cables that electrically couple between an inverter module and a motor, in accordance with the disclosure.

FIG. 3 schematically shows an embodiment of a high-voltage electrical cable monitoring scheme 300 that is employed to monitor high-voltage electric cables that electrically couple between an inverter module and a motor, including a system that employs a high-voltage electrical connector to electrically connect to the motor. Table 1 is provided as a key to FIG. 3 wherein the numerically labeled blocks and the corresponding functions are set forth as follows.

TABLE 1

| BLOCK | BLOCK CONTENTS |
| --- | --- |
| 302 | Operate motor at MTPA |
| 304 | Execute high-voltage electrical cable monitoring |
| 310 | Are enable criteria met? |
| 315 | Is there a sufficient magnitude of AC current to execute OCD test? |
| 320 | Non-intrusively adjust electrical current |
| 330 | Execute OCD test |
| 332 | Is AC current greater than threshold? |
| 340 | Run X:Y fault analysis |
| 350 | Report result |

The motor operates to generate torque responsive to a torque command, which includes optimizing the torque command by commanding operation of the motor along the maximum torque per ampere curve (MTPA), an example of which is shown as line segment 220 on FIG. 2 (302). Periodically, monitoring the high-voltage electrical cable is commanded during vehicle operation, which includes executing an open circuit diagnostic (OCD) test (304). This includes executing the OCD test at powertrain power up, and periodically executing the OCD test when magnitude of the AC current is less than a minimum threshold, including when motor speed is less than a minimum threshold. The OCD test also executes continuously when the AC current magnitude is above a minimum threshold.

The OCD test runs only when enable criteria are met (310). The enable criteria include parameters related to a periodic function timer, a current monitor, and other related criteria. The periodic function timer monitors a prescribed time period, and employs a count-down timer that measures an elapsed period of time since the OCD test was last executed. In one embodiment, the periodic function timer has a prescribed time period that is on the order of magnitude of 15 minutes. Alternatively, the periodic function timer can have a prescribed time period that is on the order of magnitude of 300-500 milliseconds. The periodic function timer indicates passage of the prescribed time period since last executing an iteration of the OCD test and is employed to ensure that the OCD test runs periodically, i.e., at least once each prescribed time period. This assures that the OCD test executes at least at calibratable intervals, including during times when the commanded current is below a minimum commanded AC electric current associated with an OCD threshold. The current monitor determines whether the electrical current is of sufficient magnitude such that it is greater than the minimum commanded AC electric current, which is a minimum current associated with signal/noise of the current sensors. To run the OCD test, it is necessary for the AC current to be equal to or greater than the minimum commanded AC electric current to overcome a signal/noise ratio of the current sensors, and can be 5 to 10% of a maximum current in one embodiment. Other related criteria that can enable or preclude executing the OCD test include results associated with current sensor circuit fault diagnostics.

When the enable criteria are not met (310)(0), the system rechecks the enable criteria during a subsequent iteration. When the enable criteria are met (310)(1), the system determines whether there is a sufficient magnitude of AC current to execute the OCD test, i.e., whether the commanded AC current is greater than the minimum commanded AC electric current (315). When there is a sufficient magnitude of AC current to execute the OCD test (315)(1), the OCD test executes (330).

When there is insufficient magnitude of AC current to execute the OCD test, i.e., when the commanded AC current is less than the minimum commanded AC electric current (315)(0), control of the motor is non-intrusively adjusted to increase the electric current to the minimum commanded AC electric current level that permits the OCD test to execute without affecting the torque output from the motor, i.e., permits the OCD test to execute while coincidently maintaining a constant torque output from the motor. This includes increasing the commanded electrical current to the minimum commanded AC electric current to overcome the signal/noise ratio of the current sensors that are employed to monitor the multi-phase power circuit without adjusting torque output from the motor (320). Increasing the electrical current to the minimum commanded AC electric current includes non-intrusively adjusting Id and Iq currents along the constant torque line 230 to achieve the minimum commanded AC electric current to execute the OCD test while maintaining the torque output from the motor. When execution of the OCD test includes non-intrusively increasing the electric current, e.g., at low speeds, it is sufficient to only consider the current magnitude constraint, and assume that there is sufficient voltage margin to control the Id and Iq currents anywhere on the constant current circle 210 while generating torque.

FIG. 2 graphically shows current properties including the constant current circle 210 representing the minimum commanded AC electric current having sufficient current magnitude for successfully executing the OCD test for an embodiment of the motor described with reference to FIG. 1. A present operating point 228 is also shown, which is a magnitude of current that is less than the minimum commanded AC electric current associated with the constant current circle 210. The present operating point 228 is plotted on a MTPA curve 220. A constant torque line 230 is depicted for the present operating point 228. A projected operating point 224 can be derived, and represents an operating point associated with the same magnitude of torque as the present operating point 228, indicated where the constant torque line 230 intersects with the constant current circle 210 representing the minimum commanded AC electric current.

Executing the OCD test includes verifying that the magnitude of AC current flowing through the AC cables is greater than a threshold current when operating at the minimum commanded AC electric current (330). Thus, the OCD test measures the AC current, e.g., employing the current sensors 34 deployed to monitor the electrical leads of the electric cable 32 as described with reference to FIG. 1, and compares the measured AC current to a threshold current (332), with the threshold current set as a minimum current. A current level that is below the minimum current indicates likelihood of an open circuit. When the magnitude of the measured AC current is less than the threshold current with some allowance for error (332)(0) it indicates presence of a fault associated with an open circuit this iteration. When the magnitude of the measured AC current is greater than or equal to the threshold current with some allowance for error (332)(1) it indicates absence of a fault associated with an open circuit this iteration. The resultant, regardless of whether presence or absence of a fault is indicated for this iteration, is input to an X:Y fault analyzer (340), and a report is generated (350) for this iteration of the test. In one embodiment, the generated report includes absence or presence of a fault.

The X:Y fault analyzer (340) includes an accounting of a quantity of identified faults (X) as compared to a selected quantity of immediately prior iterations (Y). In one embodiment, a quantity of three identified faults (X) in the five immediately prior iterations of the test may be required to generate a report indicating presence of an open circuit fault requiring some form of mitigation activity by the controller.

Thus, the high-voltage electrical cable monitoring scheme 300 is able to detect an open circuit indicating a disconnected AC cable within a relatively short period of time. One system response to a generated report associated with presence of a fault includes setting diagnostic trouble codes and executing a system shutdown to a safe state if the AC connector is not detected. A system shutdown to a safe state includes ensuring that there is no voltage and no current present at AC motor terminals.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. Method for monitoring a multi-phase power circuit between an inverter and an electric machine, comprising:
   non-intrusively adjusting a commanded AC electric current from the inverter after a prescribed time period, comprising;
      monitoring a period of time subsequent to a previous execution of an open circuit diagnostic test; and
      non-intrusively adjusting the commanded AC electric current from the inverter when the monitored period of time exceeds the prescribed time period;
   comparing a measured magnitude of AC electric current in the multi-phase power circuit with a minimum threshold; and
   detecting presence of an open circuit fault in the multi-phase power circuit based upon the comparison.

2. The method of claim 1, wherein non-intrusively adjusting the commanded AC electric current from the inverter comprises non-intrusively adjusting the commanded AC electric current to a minimum commanded AC electric current sufficient for executing an open circuit diagnostic test.

3. The method of claim 2, wherein said minimum commanded AC electric current sufficient for executing an open circuit diagnostic test comprises a magnitude of AC electric current that is greater than a minimum current associated with a signal/noise ratio of current sensors employed to monitor the multi-phase power circuit without adjusting torque output from the electric machine.

4. The method of claim 1, wherein non-intrusively adjusting the commanded AC electric current from the inverter comprises non-intrusively adjusting direct and quadrature current commands along a constant torque line to achieve an AC electric current sufficient to execute an open circuit diagnostic test and maintain a constant torque output from the electric machine.

5. The method of claim 1, wherein detecting presence of an open circuit fault in the multi-phase power wiring circuit based upon the comparison comprises detecting a fault in the multi-phase power wiring circuit when the measured magnitude of AC current in the multi-phase power wiring circuit is less than the minimum threshold.

6. The method of claim 1, wherein detecting presence of an open circuit fault in the multi-phase power wiring circuit based upon the comparison comprises detecting absence of a fault in the multi-phase power wiring circuit when the measured magnitude of AC current in the multi-phase power wiring circuit is greater than the minimum threshold.

* * * * *